United States Patent [19]

Sherstinsky et al.

[11] Patent Number: 5,326,725
[45] Date of Patent: Jul. 5, 1994

[54] CLAMPING RING AND SUSCEPTOR THEREFOR

[75] Inventors: Semyon Sherstinsky, San Francisco; Charles C. Harris, Los Gatos; Mei Chang, Cupertino; Dale R. Du Bois, Los Gatos; James F. Roberts, Campbell; Susan Telford, Cupertino; Ronald L. Rose, Los Gatos; Meng C. Tseng, San Jose; Karl A. Littau, Sunnyvale, all of Calif.

[73] Assignee: Applied Materials, Inc., Santa Clara, Calif.

[21] Appl. No.: 31,259

[22] Filed: Mar. 11, 1993

[51] Int. Cl.⁵ ............................................. C23C 16/00
[52] U.S. Cl. ........................ 437/225; 427/248.1; 118/728; 118/725; 118/500; 118/503
[58] Field of Search ............... 118/728, 725, 500, 503; 427/248.1; 437/225

[56] References Cited

U.S. PATENT DOCUMENTS

| | | | |
|---|---|---|---|
| 4,932,358 | 6/1990 | Studley | 118/728 |
| 4,951,601 | 8/1990 | Maydan | 118/719 |
| 5,075,256 | 12/1991 | Wang | 118/620 |

Primary Examiner—Richard Bueker
Attorney, Agent, or Firm—Birgit E. Morris

[57] ABSTRACT

A clamping ring having a downwardly extending finger that mates with a pocket in the periphery of a susceptor for supporting a wafer in a chemical vapor deposition chamber, provides alignment of the clamping ring, the wafer and the susceptor. A source of inert gas connected to the pocket provides a positive pressure in the pocket that prevents reactive gas in the chamber from reaching the edge and backside of the wafer. A source of vacuum connected to the susceptor support surface ensures good contact between the wafer and the susceptor.

The clamping ring also has a lip extending over the top surface of the wafer having a rear surface that has a negative angle with respect to the upper surface of the clamping ring, providing a knife edge seal to the wafer, reducing the area of contact between the clamping ring and the wafer and providing a reduced area of thermal contact between the clamping ring and the wafer.

13 Claims, 2 Drawing Sheets

CLAMPING RING AND SUSCEPTOR THEREFOR

This invention relates to improved apparatus and method for depositing metals using a chemical vapor deposition (CVD) process. More particularly, this invention relates to improved apparatus and method for depositing metals on a silicon wafer that avoids deposition on the edge and backside of the wafer.

BACKGROUND OF THE INVENTION

Metals such as tungsten are deposited in openings and on the surface of a silicon wafer during manufacture of integrated circuits, preferably using chemical vapor deposition (CVD) methods. The wafer to be processed is supported on a heated susceptor which forms one electrode. The gas manifold plate of the chamber forms the other electrode. A gas, such as $WF_6$, is supplied through a plurality of openings in the gas manifold plate situate generally parallel to and above the susceptor.

Tungsten is generally deposited using $WF_6$ gas. Since ions formed from $WF_6$ are highly mobile and reactive, tungsten also deposits on the edge and backside of the wafer. The backside of a wafer is generally used for registration purposes, and therefore it is important that the wafer backside surface be kept smooth and clean. Thus any tungsten that deposits on the edge or backside of the wafer must be removed. In order to protect the edge and backside of the wafer from such deposition, a clamping ring that overlies the peripheral edge of the wafer to be processed is used to press the wafer against the susceptor, and protect the wafer edge and backside from metal deposition. The use of a clamping ring is advantageous in that only the force caused by the weight of the clamping ring is used against the wafer, which causes a minimum amount of stress on the wafer. However, several problems are still being encountered.

There are various alignment problems between the wafer and the susceptor and between the wafer and the clamping ring.

It is difficult to align the clamping ring so that its center is aligned perfectly both with the center of the wafer and with the center of the susceptor, and to align the center of the wafer with the center of the susceptor. When these elements are misaligned however, it is impossible to produce a uniform tungsten film on the wafer due to non-uniformities of heat transfer from the susceptor to the wafer, and to deposit a tungsten film that is centered with respect to the wafer. Thus the distance of the tungsten film from the edge of the wafer can vary enough so that die near the edge of the wafer may be missed entirely by the metal deposition, reducing the yield from the wafer.

Further, if the clamping ring, due to misalignment, becomes tilted with respect to the surface of the wafer, tungsten can deposit on the edge and backside regions of the wafer.

It is even more difficult to entirely prevent deposition of tungsten on the edge and backside of the wafer, even when using a clamping ring in its correct position. Studley et al, see U.S. Pat. No. 4,932,358, addressed this problem and discloses an elaborate closure between the clamping ring and the susceptor, producing a strong force pressing the wafer to the susceptor. This strong force can cause stress in the wafer, even leading to damage and cracks in the wafer; and it can cause the susceptor to become deflected from its position parallel to the gas manifold plate, which leads to non-uniformities of the deposited film. A wafer seal ring is mounted on a movable assembly that can be pressed against a wafer mounted on a susceptor by spring means, creating a force of from about 10-40 pounds. The wafer seal is aligned only with respect to the susceptor; the wafer is aligned only by means of pin supports on the susceptor. Thus if the wafer is misaligned with respect to the susceptor, it will also be misaligned with respect to the clamping ring. Further, the clamping ring overlaps the wafer edge by about 3-5 mm. Thus the alignment of the susceptor to the wafer to the clamping ring depends on the sum of the tolerances of these parts, and thus the chances of obtaining a perfect alignment are slim.

Thus it would be highly desirable to provide an improved apparatus and method to prevent deposition of tungsten or other metals on the edge and backside of a wafer during CVD processing, and to readily align the centers of the clamping ring, wafer and susceptor to improve uniformity of the metal film deposited on the wafer.

SUMMARY OF THE INVENTION

Our new clamping ring and susceptor has several built-in features to improve the alignment of a clamping ring, a wafer and a susceptor with respect to each other; to improve uniformity of metal film deposition on the wafer; and to ensure a tight seal between the clamping ring and the wafer, thereby preventing edge and backside deposition on the wafer but without causing wafer stress. The clamping ring of the invention has backside fingers that mate with pockets built into the edge of the susceptor. When the backside finger of the clamping ring is mated to the susceptor pocket, the clamping ring is perfectly aligned with the susceptor. At the same time, the clamping ring finger urges the wafer into a preselected position on the susceptor, thereby assuring that the wafer is centered on the susceptor.

As a further feature, the backside of the clamping ring has a negative angle with respect to its frontside which provides a knife edge seal against the wafer, further reducing the likelihood that reactive gases can pass between the clamping ring and the wafer and that tungsten will deposit onto the edge and backside of the wafer.

Still further, the susceptor has an opening near its center which is connected to a controllable vacuum exhaust pump. When the vacuum is turned on, it pulls the wafer down against the susceptor, thereby improving the contact between the wafer and the susceptor. This reduces any gap between the wafer and the susceptor, thereby ensuring uniform heating of the wafer by the susceptor; and the resultant tight fit also decreases the likelihood that reactive gases will reach the edge and the backside surfaces of the wafer. By pulling the wafer down against the susceptor surface without the use of a seal ring, the possibility that the susceptor will be tilted with respect to the gas manifold plate is also reduced.

Still another feature of the present susceptor is that a positive flow of a purge gas is maintained in the pockets of the susceptor. The purge gas increases the pressure in the pockets with respect to the processing chamber pressure. This positive pressure also acts to prevent the reactive gases from leaking to the edge and backside surfaces of the wafer.

DETAILED DESCRIPTION OF THE INVENTION

Figure 1:
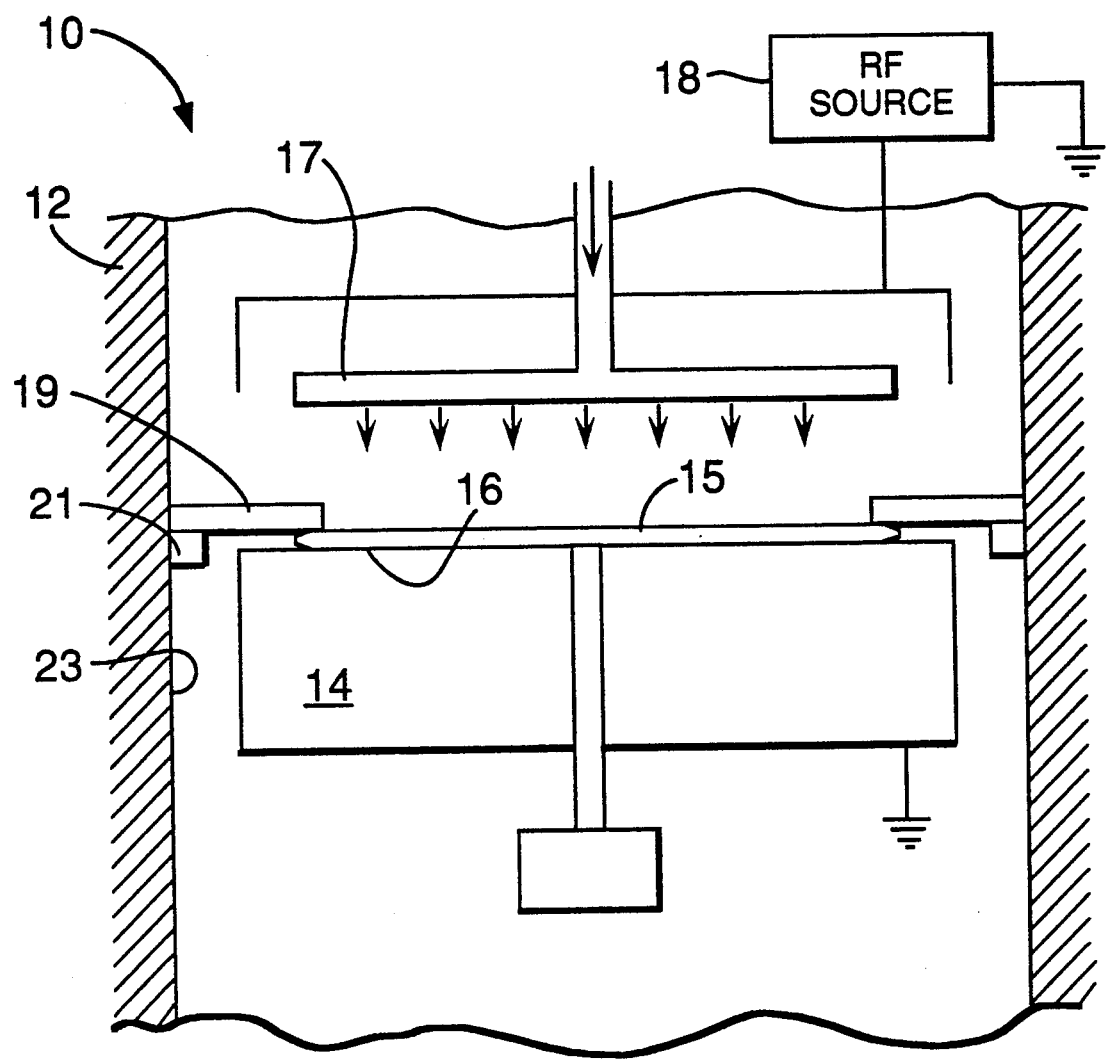
FIG. 1 is a cross sectional view of a prior art CVD chamber partly in schematic.

The present invention will be further described by reference to FIG. 1 which shows a single substrate CVD system 10 in which the clamping ring and susceptor of the invention are useful.

A single substrate vacuum chamber 12 includes a heated susceptor 14 which heats a wafer 15 supported on its upper susceptor surface 16 by direct contact of the wafer 15 and the upper surface 16. Reactant gases, such as $WF_6$, are supplied by means of a plurality of openings in a gas manifold plate 17, which is connected to an RF power source 18 and matching network in conventional manner. A clamping ring 19 overlies the edge of the wafer 15 during processing. The clamping ring 19 is supported when not in use by a support mount 21 on the inner wall 23 of the chamber 12. When the wafer is heated to an elevated deposition temperature and the reactive gases for tungsten deposition are flowed into the chamber in the space between the gas manifold plate 17 and the susceptor 14, tungsten will deposit onto the wafer 15. Excellent step coverage and tungsten deposition in high aspect ratio openings in the wafer 15 can be obtained. By keeping the volume between the susceptor 14 and the gas manifold plate 17 small, and by preventing deposition of tungsten on the edge and backside of the wafer 15, the design is highly efficient, reducing the amount of expensive $WF_6$ required for deposition. The reactor chamber 12 also includes an exhaust system and a port for ingress and egress of a wafer (not shown).

Figure 2:
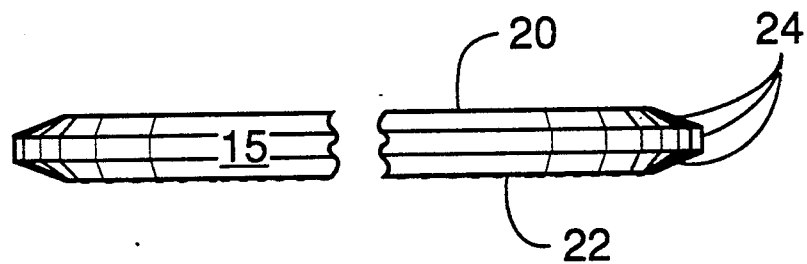
FIG. 2 is a cross sectional view of a state of the art semiconductor silicon wafer.

FIG. 2 is a cross sectional view of the edge configuration of a state of the art silicon wafer. The top surface 20, is highly polished and in addition can have a thin layer such as titanium nitride thereon, to improve the adhesion of the deposited tungsten layer. The bottom surface 22 and the three edge surfaces 24 are not polished, and typically have an exposed layer of native silicon dioxide, to which a deposited tungsten layer does not adhere well. Thus any tungsten deposited on the bottom surface 22 or the edge surfaces 24 does not adhere as well as the tungsten deposited onto the top surface 20, and can readily flake off, contaminating the wafer and the susceptor and other parts of the chamber 12 with particulate debris.

Figure 3:
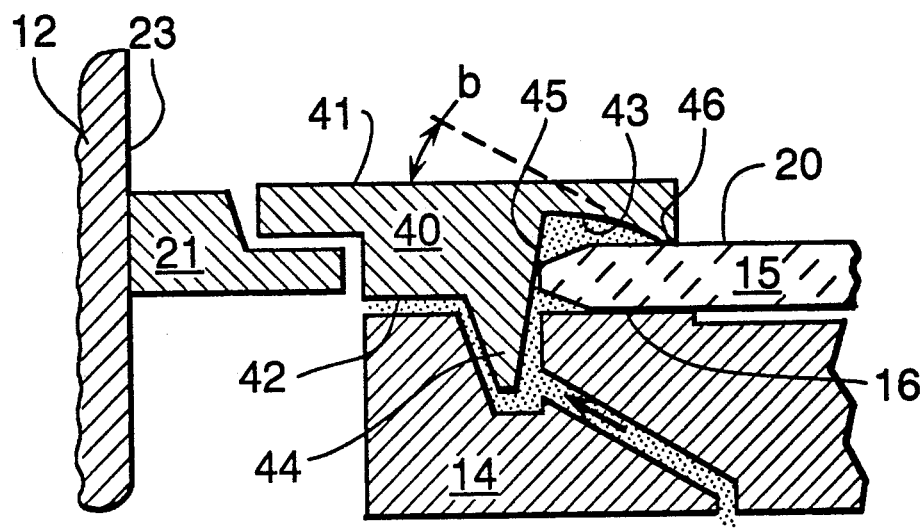
FIG. 3 is a cross sectional view of a clamping ring of the invention in contact with a wafer mounted on a susceptor support.

FIG. 3 is a cross sectional view of a shadow ring 40 of the invention in contact with a wafer 15 mounted on the top surface 16 of the susceptor 14. The shadow ring 40 has an upper surface 41 and a lower surface 42. The upper surface 41 is essentially flat. The lower surface 42 has a lip portion 43 that overlies a wafer 15, generally at least 1 mm and up to 5-7 mm from the periphery of the wafer 15 so as to completely cover the periphery of the top surface 20 of the wafer 15, and a finger portion 44 extending therefrom. The shadow ring 40 has a thickness of, for example, about 6 mm, so that the weight of the shadow ring 40 can provide a positive contact to the polished surface 20 of the wafer. The outer finger side 45 is angled with respect to the lip 43 at an angle greater than 90°.

As the susceptor 14 and the wafer 15 are contacted by the finger edge 45, any misalignment of the wafer 15 on the susceptor 14 is corrected, the finger edge 45 urging the wafer 15 into a predetermined position.

The lower surface of the lip 43 has a negative angle with respect to the upper surface 41. This negative angle "b" is less than 90°, as can be seen by the dotted line extension of the underside 43 of the clamping ring 40 as it intersects the upper surface 41. This negative angle provides a knife edge seal to the wafer at 46. This knife edge seal 46 also minimizes the area of contact between the clamping ring 40 and the wafer 15, which can be as low as 0.5 mm wide. In contrast, the prior art clamping rings overlap wafers by about 3-5 mm. This small area of contact reduces heat losses from the edge of the wafer to the clamping ring 40. For this reason, the knife edge seal 46 also ensures a more uniform deposition of metal onto the wafer 15, since the wafer 15 has a uniform temperature across its top surface 20. If the edge surfaces 24 of the wafer 15 are cooler than the remainder of the wafer, a non-uniform metal deposition may occur.

Another advantage of the shadow ring 40 of the invention is that, because the ring-wafer-susceptor alignment can be accurately maintained and because the knife edge seal 46 requires only a very small area of contact between the clamping ring 40 and the wafer 15, the overlap between the clamping ring 40 and the wafer 15 can be reduced, e.g., from about 3-5 mm to only about 1.5 mm. This enlarges the area of the top surface 20 of the wafer 15 that is metal coated.

A still further advantage of the present invention is that the clamping pressure applied to the wafer 15 by the clamping ring 40 is more uniform due to the knife edge seal 46, and is smaller, thereby reducing chances of damage or stress to the wafer during processing.

Figure 4:
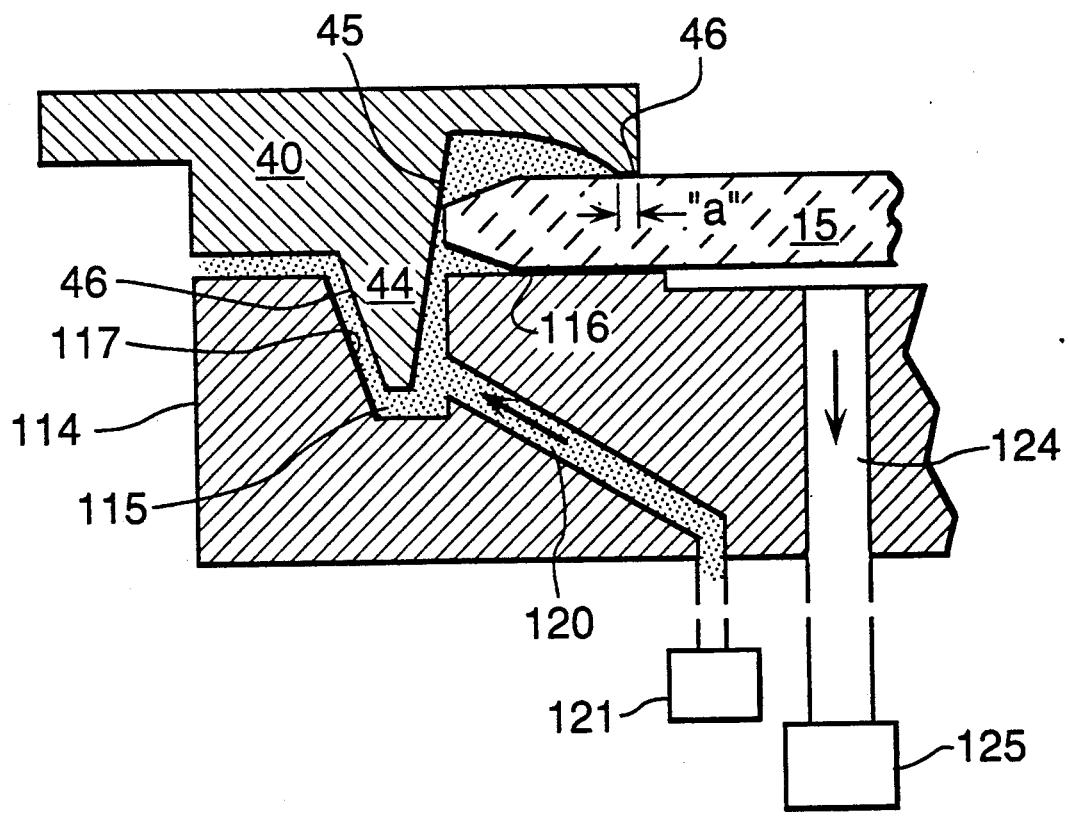
FIG. 4 is an expanded view of a clamping ring of the invention in a processing position with a wafer and a susceptor of the invention.

FIG. 4 is a cross sectional expanded view showing the clamping ring 40 of the invention in its processing position with respect to a wafer 15 to be processed and to a modified susceptor 114 of the invention.

The susceptor 114 of the invention has a pocket 115 in its upper surface 116. The side 117 of the pocket 115 has sloped sides matching the slope of the finger sidewalls 46 of the clamping ring 40. Thus when the susceptor 114 is moved into processing position, thereby raising the clamping ring 40 so that it is supported solely by the wafer 15, any misalignment between the clamping ring 40, the wafer 15 and the susceptor 114 is corrected; the outer edge 45 of the finger 44 nudges the wafer 15 and itself into correctly aligned position with respect to the susceptor 114; and the mating surfaces 46 of the clamping ring 40 and the pocket wall 117, ensuring alignment of the clamping ring 40 and the susceptor 114.

The pocket 115 is connected by means of a purge gas feed line 120 in the susceptor 114 to a source 121 of an inert gas. The feed line 120 is connected to a controllable inert gas source such as argon. The gas source 121 has a flow controller (not shown) that allows manual or other manipulation of the inert gas flow. The gas flow must be high enough so that the pressure in the pocket 115 is higher than the pressure in the rest of the processing chamber 12, on the order of from about 0.1 Torr or more higher. However, the gas pressure must be low enough so that no lifting of the clamping ring 40 and/or of the wafer 15 from the upper surface 116 of the susceptor 114 occurs. The positive pressure in the pocket 115 also helps prevent the reaction gas from passing into the pocket area 115, thus further protecting the edge and backside of the wafer 15 from tungsten deposition. The gas flow can be adjusted as needed to compensate for variations in the size of the wafer and the amount of compression between the wafer 15 and the susceptor 114. Suitably an inert gas flow of from about 10-2000 sccm will be maintained. If any deposition is noted on the edge or backside of a wafer after processing, the inert gas pressure can be increased. The inert gas is removed by the vacuum system of the CVD system 10.

The top surface 116 of the susceptor 114 is also provided with a small channel 124 near its center which is connected to a controllable source of vacuum 125, which vacuum source is separate from the exhaust system of the chamber 12. When the vacuum source 125 is turned on, the wafer 15 is drawn down to the upper surface 116 of the susceptor 114, thereby pulling the wafer 15 closer to the top surface 116 of the susceptor 114, and decreasing any gap between the wafer 15 and the susceptor 114. This feature provides several improvements; it improves the heating and/or cooling of the wafer 15 by the susceptor 114 during processing; and it further prevents processing gas from depositing onto the backside surface 22 of the wafer 15. This feature also ensures that the wafer does not move or float during processing.

The processing sequence is preferably as follows: after the wafer 15 is placed onto the susceptor 114, generally by automated means, the susceptor 114 is raised so that the wafer 15 contacts and lifts the overlying clamping ring 40 away from its support mount 21. Thus the wafer 15 is pressed against the top surface 116 of the susceptor 114 by the full weight of the clamping ring 40, which suitably weighs about 0.5-1 lb or so. The fingers 44 of the clamping ring 40 mate with the sidewalls 117 of the susceptor pockets 115 and any misalignments between the shadow ring 40, the wafer 15 to be processed and the susceptor 114 are corrected. The negative angle of the backside 43 of the clamping ring 40 creates a knife edge seal on the perimeter of the wafer 15 that extends at least to the polished or adhesive-coated surface 20 of the wafer 15. The width of the knife edge seal is shown at "a". The vacuum source 125 in the susceptor 114 is then turned on to ensure a tight contact between the upper surface 116 of the susceptor 114 and the backside 22 of the wafer 15 and to ensure that the alignments between the wafer, the susceptor and the clamping ring are maintained. Thereafter a gas flow of inert gas from the gas source 120 is started to create a higher pressure in the pocket 115 than in the remainder of the vacuum chamber 12. Deposition of tungsten is then started in the reaction chamber 12 by feeding reactant gases, such as $WF_6$, through the gas manifold plate 17. After the desired thickness of deposited tungsten is reached, the reaction gas flow is stopped, and the susceptor 114 and the wafer 15 thereon is lowered so that the contact between the wafer 15 and the clamping ring 40 is broken. The clamping ring 40 is now again supported by the ring supports 21 affixed to the walls 23 of the chamber 12. The inert gas flow to the susceptor 114 is shut off, as is the vacuum supply to the susceptor 114. The processed wafer now may be removed from the chamber.

Although particular features and embodiments are discussed above, other features of conventional CVD and PECVD chambers can be used; and other gases substituted for $WF_6$ for deposition of other thin films, and the like, as will be apparent to those skilled in the art. For example the present CVD chamber may be part of a vacuum system such as is disclosed by Maydan et al in U.S. Pat. No. 4,951,601 in which a plurality of separate processing chambers are connected to a transfer chamber so that multiple processing steps can be carried out on a wafer without its ever leaving a vacuum environment. Thus the invention is meant to be limited only by the scope of the appended claims.

We claim:

1. A clamping ring having an upper surface and a lip extending therefrom for engaging a substrate, and an undersurface having a downwardly extending finger adjacent to said lip, said finger having tapered sidewalls.

2. A clamping ring according to claim 1 wherein the undersurface of said lip has a negative angle with respect to said upper surface.

3. A susceptor for use in a chemical vapor deposition chamber which comprises a surface for supporting a substrate to be processed in said chamber, said surface having a pocket along the periphery thereof, and a first channel connected thereto extending from said pocket to a source of gas.

4. A susceptor according to claim 3 wherein the sidewall of said upper surface is tapered.

5. A susceptor according to claim 3 wherein said surface has a second channel therein which extends to a source of vacuum.

6. In a chemical vapor deposition chamber comprising a susceptor for supporting a wafer to be processed, in combination
    a clamping ring having an upper surface and a lip extending therefrom for engaging a substrate, and having an undersurface having downwardly extending fingers adjacent to said lip, said fingers having tapered sidewalls; and
    wherein said susceptor has a pocket along the periphery thereof sized for insertion therein of said fingers of said clamping ring.

7. A chamber according to claim 6 wherein said susceptor has a channel that extends from said pocket to a source of gas.

8. A chamber according to claim 6 wherein said susceptor support surface has a channel therein that extends from said surface to a source of vacuum.

9. A chamber according to claim 6 wherein said the undersurface of said lip of said clamping ring has a negative angle with respect to the upper surface of said clamping ring.

10. A method of preventing deposition on the edge and backside of a semiconductor wafer during chemical vapor deposition processing which comprises;
    mounting a wafer to be processed onto a susceptor surface in a chemical vapor deposition chamber;
    providing a clamping ring having a lip for overlying the edge of said wafer and downwardly extending fingers adjacent to said lip;
    providing pockets in said susceptor surface along the periphery thereof sized to accommodate said fingers therein; whereby the clamping ring aligns the wafer and the susceptor as the fingers are inserted into said pockets.

11. A method according to claim 10 wherein a source of gas is connected to said pocket so that the pressure in said pocket is higher than the pressure in the remainder of said chamber.

12. A method according to claim 10 wherein a source of vacuum is connected to said susceptor surface so that a vacuum draws the wafer down onto the susceptor surface.

13. A method according to claim 11 wherein a source of vacuum is connected to said susceptor surface so that a vacuum draws the wafer down onto the susceptor surface.

* * * * *